(12) United States Patent
Chen

(10) Patent No.: US 6,287,931 B1
(45) Date of Patent: Sep. 11, 2001

(54) METHOD OF FABRICATING ON-CHIP INDUCTOR

(75) Inventor: Wei-Fan Chen, Taichung (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/241,548

(22) Filed: Feb. 1, 1999

(30) Foreign Application Priority Data

Dec. 4, 1998 (TW) ................................................ 87120182

(51) Int. Cl.$^7$ ....................................................... H01L 21/20
(52) U.S. Cl. ........................... 438/381; 438/618; 438/622
(58) Field of Search ...................................... 257/531, 664; 438/381, 618, 622, 634, 667

(56) References Cited

U.S. PATENT DOCUMENTS

| | | | |
|---|---|---|---|
| 3,765,082 | * 10/1973 | Zyetz ................................. | 257/531 |
| 3,798,059 | * 3/1974 | Astle et al. ........................ | 257/531 |
| 5,384,274 | * 1/1995 | Kanehachi ........................ | 438/381 |
| 5,446,311 | 8/1995 | Ewen et al. . | |
| 5,539,241 | 7/1996 | Abidi et al. . | |
| 5,559,363 | * 9/1996 | Immorlica ......................... | 257/664 |
| 5,742,091 | * 4/1998 | Hebert ............................... | 257/531 |
| 5,844,299 | * 12/1998 | Merrill et al. ..................... | 257/531 |
| 5,918,121 | * 6/1999 | Wen et al. ......................... | 438/381 |
| 5,930,637 | * 7/1999 | Chuang et al. ................... | 438/381 |
| 6,002,161 | * 12/1999 | Yamazaki ......................... | 257/531 |
| 6,025,261 | * 2/2000 | Farrer et al. ..................... | 438/619 |

FOREIGN PATENT DOCUMENTS

| | | | |
|---|---|---|---|
| 403019358A | * 1/1991 | (JP) .................................. | 257/531 |
| 5-82736 | * 4/1993 | (JP) .................................. | 257/531 |
| 6-21347 | * 1/1994 | (JP) .................................. | 257/531 |

* cited by examiner

Primary Examiner—Olik Chaudhuri
Assistant Examiner—Nathan W. Ha
(74) Attorney, Agent, or Firm—Ladas & Parry

(57) ABSTRACT

A method of fabricating an on-chip inductor is disclosed. First, a semiconductor substrate is patterned and etched to form a trench into which an insulating layer is filled. The insulating layer is provided with a relative permitivity smaller than silicon oxide or a relative permeability greater than silicon oxide. Then, a spiral conductive coil is formed over the insulating layer.

16 Claims, 4 Drawing Sheets

METHOD OF FABRICATING ON-CHIP INDUCTOR

BACKGROUND OF THE INVENTION

1. Field of the Invention

The present invention relates to semiconductor integrated circuit fabrication. More particularly, the present invention relates to a method of fabricating on-chip inductors over an insulating layer with low permitivity or high permeability to decrease both parasitic capacitance and mutual inductance.

2. Description of the Related Art

Miniaturization of electronic circuits is a goal in virtually every field, not only to achieve compactness in mechanical packaging, but also to decrease the cost of manufacturing the circuits. Many digital and analog circuits, including high-capacity memory devices, high-level microprocessors and operational amplifiers, have been successfully implemented in silicon based integrated circuits (ICs). These circuits typically include active devices such as bipolar junction transistors (BJTs) and field effect transistors (FETs), diodes of various types, and passive devices such as resistors and capacitors.

One area that remains a challenge to miniaturization is radio frequency (RF) circuitry, such as that used in cellular telephones, wireless modems, and other types of communication equipment. The problem is the difficulty producing a good inductor in silicon-based integrated circuits that is suitable for RF applications. Attempts to integrate inductors into silicon-based circuits have yielded either inductors of low quality factor (hereinafter, Q value) and high loss, or required special metalization layers such as gold.

Ewen et al. in U.S. Pat. No. 5,446,311 has disclosed a process for manufacturing high-Q inductors without using a noble metal such as gold. The process involves forming multiple metal layers with identical spiral patterns stacked up on an insulating layer to construct an inductor. Such multiple metal layers can decrease series resistance, thus increasing the Q value. The lump-sum equivalent circuit is as shown in FIG. 1. In FIG. 1, $C_d$ indicates the parasitic capacitances between the metal layers, $L_1$ is the inductance, $R_s$ is the series resistance of the spiral metal layers, and $C_1$ and $C_2$ are the parasitic capacitance between the substrate and the metal layers. If the semiconductor substrate is made of a lossy material such as silicon, then $R_1$ and $R_2$ indicate the parasitic resistances connected in parallel with $C_1$ and $C_2$, respectively. Since the semiconductor substrate is usually grounded, $R_1$, $R_2$, $C_1$, and $C_2$ are grounded at one end. In addition, $L_2$ designates the inductance in the substrate induced by the mutual inductance effect, and $R_{SUB}$ denotes the parasitic resistance spread over the substrate.

In semiconductor techniques, silicon oxide ($SiO_x$) is the most common insulating material, having a relatively high relative permitivity (or dielectric constant) between 3.9 and 4.5. Therefore, in U.S. Pat. No. 5,446,311, though the Q value is increased by the multiple metal layers, the high permitivity of the silicon oxide decreases the self-resonant frequency of the inductor, thus limiting the application of the inductor to high frequency.

Abidi et al., in U.S. Pat. No. 5,539,241, have disclosed an inductor which is formed in an oxide layer overlying a silicon substrate in which the silicon material underneath the inductor is selectively removed to form a pit so as to space the inductor away from the underlying silicon substrate. In the illustrated embodiment, the silicon beneath the inductor is removed by etching, leaving the inductor suspended on the oxide layer overlying the substrate. The pit beneath the inductor is filled with an insulating medium such as air so that the parasitic capacitance of the inductor is substantially reduced and yet retains a relatively large self-resonant frequency on the order of 2 GHz or more. However, the etching of the substrate makes the whole process more complicated and incompatible with BiCMOS or CMOS standard processes.

SUMMARY OF THE INVENTION

It is therefore an object of the present invention to provide a method of fabricating an on-chip inductor over an insulating layer with low permitivity or high permeability so as to decrease both parasitic capacitance and mutual inductance.

It is another object of the present invention to provide a method of fabricating an on-chip inductor compatible with BiCMOS or CMOS standard processes in addition to decreasing parasitic capacitance and mutual inductance.

The present invention achieves the above-indicated objects by providing a method of fabricating an on-chip inductor. First, a semiconductor substrate is patterned and etched to form a trench into which an insulating layer is filled. The insulating layer is provided with a relative permitivity smaller than silicon oxide or a relative permeability greater than silicon oxide. Then, a spiral conductive coil is formed over the insulating layer.

Accordingly, the formation of the spiral conductive coil over the insulating layer with low relative permitivity or high relative permeability decreases the parasitic capacitance between the conductive coil and the substrate, thus increasing the self-resonance frequency of the fabricated inductor. Moreover, the formation of the deep trench can increase the spacing between the conductive coil and the substrate, and thus lessen the mutual inductance.

BRIEF DESCRIPTION OF DRAWINGS

The following detailed description, given by way of examples and not intended to limit the invention to the embodiments described herein, will best be understood in conjunction with the accompanying drawings, in which.

DETAILED DESCRIPTION OF THE INVENTION

Figure 1:
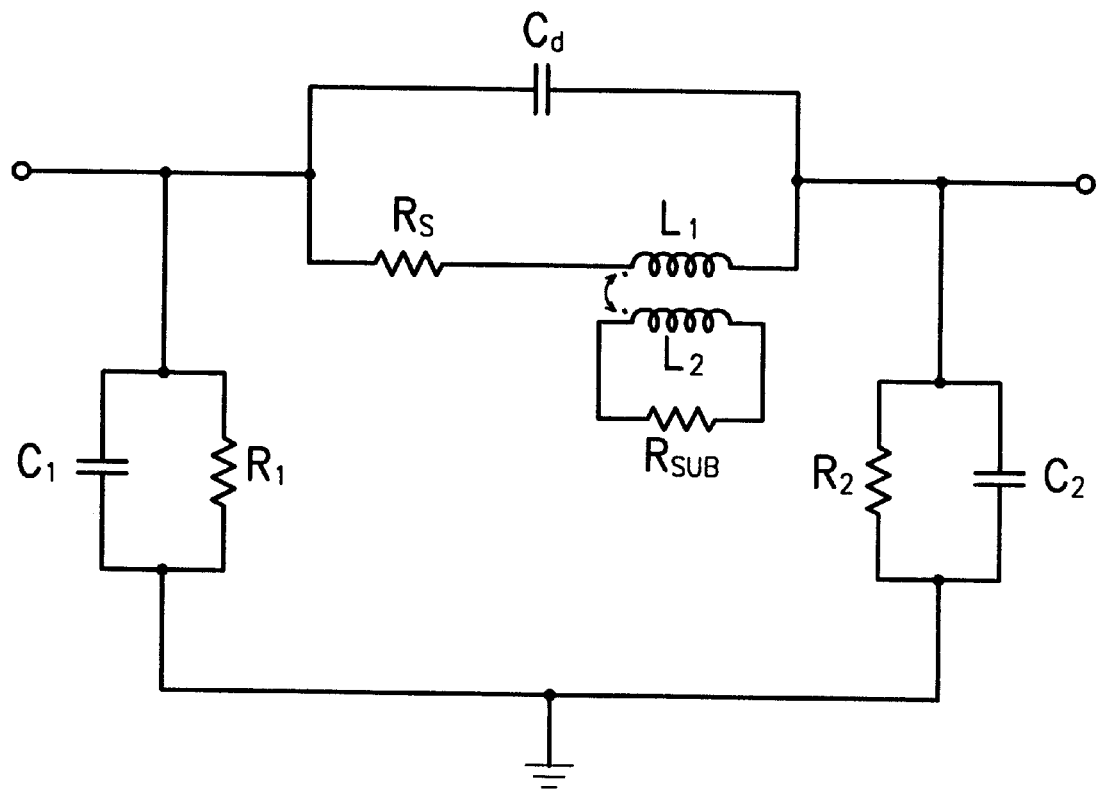
FIG. 1 schematically depicts the lump-sum equivalent circuit of the conventional on-chip inductor.

As shown in FIG. 1, there are three major degradation mechanism of an on-chip inductor: (1) lossy substrate contributing to high series resistance in the inductor path due to the image current flowing through the imperfect ground plane; (2) skin and other magnetic effects; and (3) parasitic capacitance and the associated loss. According to the present invention, the degradation mechanism for the on-chip inductor can be improved by reducing the parasitic capacitance between the spiral conductive coil and the substrate by the use of insulating material with low permitivity or high permeability; in another approach, lessening the mutual inductance, skin effect, and associated magnetic effect by an increase of the spacing between the spiral conductive coil and the substrate.

Referring to FIGS. 2A–2D, the process flow of one preferred embodiment in accordance with the present invention is schematically depicted in cross-sectional views.

Figure 2A:
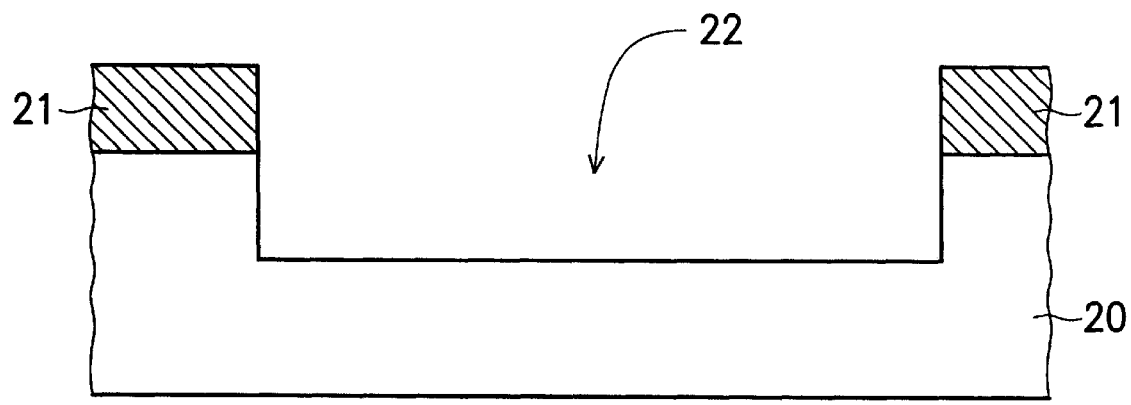
FIGS. 2A–2D schematically depict the process flow of one preferred embodiment in accordance with the present invention in cross-sectional views.

As shown in FIG. 2A, a photoresist layer 21 with predetermined patterns is formed on a semiconductor substrate 20 by means of photolithography to expose the portion on which a trench 22 to be formed. Usually, the semiconductor substrate 20 is a silicon substrate on which plural semiconductor devices, such as bipolar junction transistors and/or field-effect transistors, have been fabricated. For the purposes of simplicity, these have not been illustrated in the drawings. Then, the semiconductor substrate 20 is etched to shape the trench 22 by the patterned photoresist layer 22 as masking. Preferably, the etching procedure is performed by reactive ion etching (RIE) or high-density plasma etching (HDP) in the ambient of $SF_6$ and $O_2$. The trench 22 has a depth of about 2~100 $\mu$m, and, preferably, 2~50 $\mu$m.

Figure 2B:
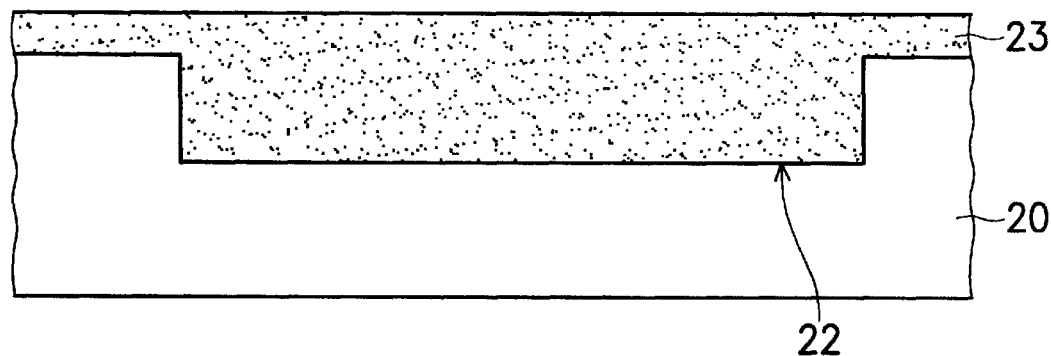

Next, as shown in FIG. 2B, an insulating layer 23 with low relative permitivity or high relative permeability is conformably deposited on the whole surface of the substrate 20, and, simultaneously, filled into the trench 22. According to the present invention, the insulating layer 23 is provided with relative permitivity less than silicon oxide, or with relative permeability greater than the silicon oxide. For example, the insulating layer 23 can be made of carbon-based polymer, such as parylene-F ($AF_4$) polymer having a permitivity of about 1.7, or made of ferrite ceramic, such as ZnO. Then, the insulating layer 23 is subjected to an etch-back or chemical-mechanical polishing (CMP) procedure to shape an even surface. Curing treatment is thereafter applied to the insulating layer 23.

Next, a conductive layer deposited and patterned to be a wire 24, preferably made of aluminum-copper (Al—Cu) alloy under which a barrier layer (not shown in the drawing) made of titanium or titanium nitride is optionally formed to prevent aluminum from spiking the silicon substrate 20. The formation of the wire 24 can be realized by first depositing an Al—Cu alloy layer, for example, by physical vapor deposition (PVD), and then patterning and anisotropically etching to define the pattern of the wire 24. Such anisotropic etching procedure is performed by RIE or HDP in chloride containing ambient.

Figure 2C:
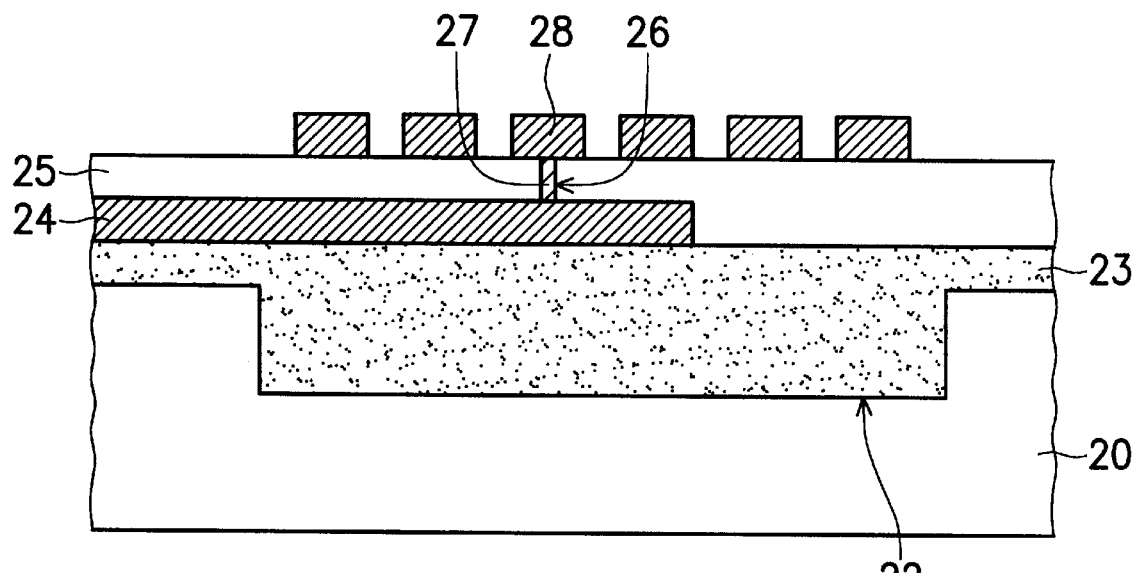
Figure 3:
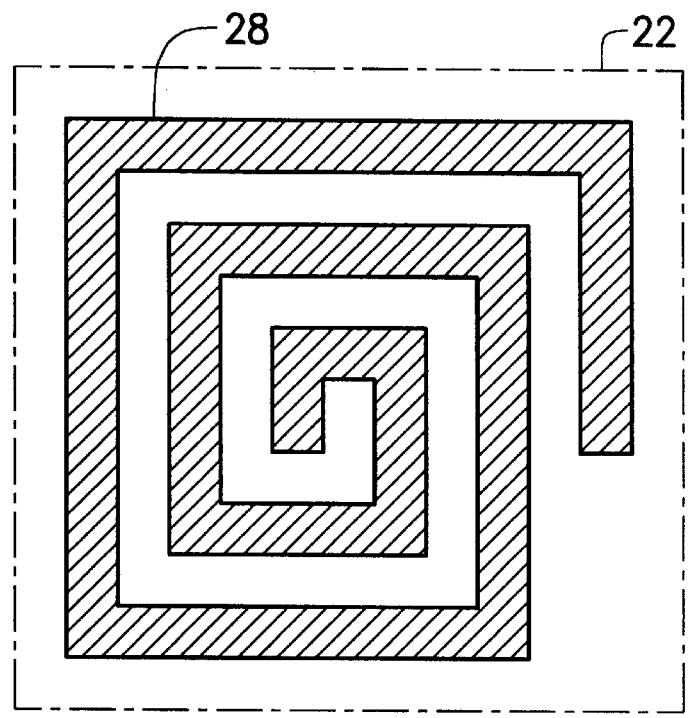
FIG. 3 depicts the top view of FIG. 2C.

Subsequently, a first dielectric layer 25 is deposited to overlie the insulating layer 23 as well as the wire 24, and then patterned and etched to form a via hole 26 therein. Next, a conductive layer is deposited to cover the first dielectric layer 25, and patterned and etched to form a spiral conductive coil 28 as shown in FIG. 2C. The top view of FIG. 2C is illustrated in FIG. 3. The spiral conductive coil 28 can be made of Al—Cu alloy deposited, for example, by means of PVD. The spiral conductive coil can be provided with one end either directly filled into the via hole 26 in contact with the wire 24, or electrically connected to the wire 24 through a metal plug 27 of tungsten filled in the via hole 26.

Again note, the formation of the wire 24 and the dielectric layer 25 is optional.

Figure 2D:
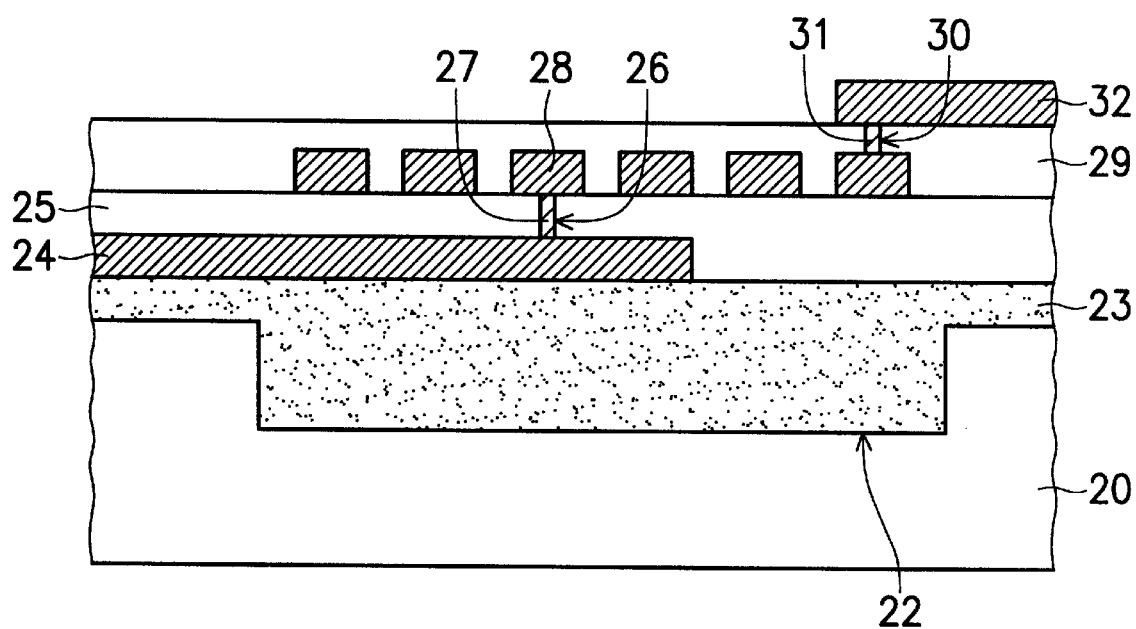

Subsequently, a second dielectric layer 29 of, for example, silicon oxide is conformably deposited by plasma-enhanced chemical vapor deposition over the whole surface, and then patterned and etched to form a via hole 30 therein. A conductive layer is deposited, patterned and etched to be a wire 32 as shown in FIG. 2D. The wire 32 can be made of Al or Al—Cu alloy by means of PVD either directly filled into the via hole 30 in contact with the other end of the spiral conductive coil 28, or electrically connected to the other end of the spiral conductive coil 28 through a metal plug 31 of tungsten filled in the via hole 30.

Accordingly, the spiral conductive coil 28 is formed over the insulating layer 23 with low relative permitivity or high relative permeability so as to decrease the parasitic capacitances $C_1$ and $C_2$ between the conductive coil 28 and the substrate 20, thus increasing the self-resonance frequency of the fabricated inductor. Moreover, the formation of the deep trench 22 can increase the spacing between the conductive coil 28 and the substrate 20, and thus lessen the mutual inductance.

Figure 4:
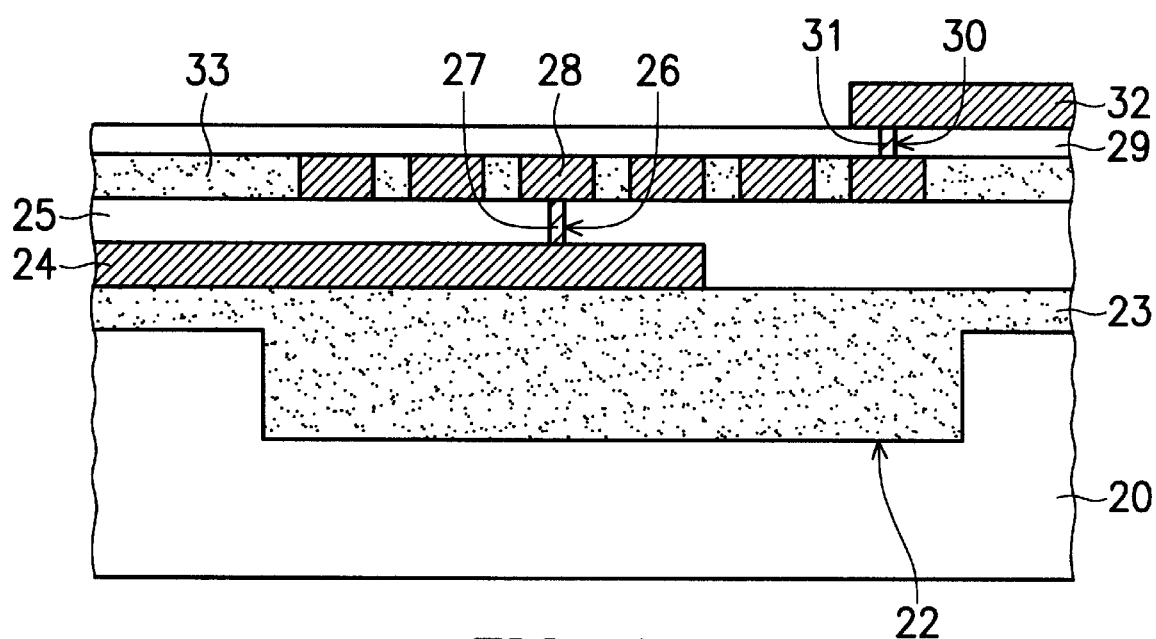
FIG. 4 schematically depicts the cross-sectional view of another preferred embodiment in accordance with the present invention.

Referring to FIG. 4, another preferred embodiment in accordance with the present invention is schematically depicted in a cross-sectional view. After the formation of the spiral conductive coil as depicted in FIG. 2C, an insulating layer 33 is filled into the space around the spiral conductive coil 28. Preferably, the insulating layer 33 is made of the same material as the insulating layer 23 with a relative permitivity lower than silicon oxide or a relative permeability greater than silicon oxide. For example, the insulating layer 33 can be made of carbon-based polymer, such as parylene-F ($AF_4$ polymer) having a permitivity of about 1.7 so as to further decrease the parasitic capacitance $C_d$, or made of ferrite ceramic, such as ZnO so as to increase the inductance $L_1$.

Next, the second dielectric layer 29 of, for example, silicon oxide is conformably deposited by plasma-enhanced chemical vapor deposition on the surface, and then patterned and etched to define the via hole 30 therein. A conductive layer is deposited, patterned and etched to be the wire 32, as shown in FIG. 4. The wire 32 can be made of Al or Al—Cu alloy by means of PVD and is either directly filled into the via hole 30 in contact with the other end of the spiral conductive coil 28, or electrically connected to the other end of the spiral conductive coil 28 through a metal plug 31 of tungsten filled in the via hole 30.

While the invention has been described with reference to various illustrative embodiments, the description is not intended to be construed in a limiting sense. For example, two or more metal layers can be stacked to implement the spiral conductive layers 28 to further lower series resistance Rs and thus increase the quality factor of the fabricated inductor. It is therefore contemplated that the appended claims will cover any such modifications or embodiments as may fall within the scope of the invention defined by the following claims and their equivalents

What is claimed is:

1. A method of fabricating an on-chip inductor, comprising the steps of:

patterning a semiconductor substrate to form a trench;

forming an insulating layer in said trench, said insulating layer having a relative permitivity smaller than silicon oxide; and forming a spiral conductive coil over said insulating layer.

2. The method as claimed in claim 1, wherein said insulating is made of carbon-based organic polymer.

3. The method as claimed in claim 2, wherein said insulating layer is made of $AF_4$ polymer.

4. The method as claimed in claim 1, wherein said trench has a depth of about 2~100 $\mu$m.

5. The method as claimed in claim 1, further comprising an additional insulating layer filled into spacing around said spiral conductive coil.

6. The method as claimed in claim 5, wherein said additional insulating layer is made of carbon-based organic polymer.

7. The method as claimed in claim 6, wherein said additional insulating layer is made of $AF_4$ polymer.

8. A method of fabricating an on-chip inductor, comprising the steps of:

patterning a semiconductor substrate to form a trench;

forming an insulating layer in said trench, said insulating layer having a relative permeability greater than silicon oxide; and forming a spiral conductive coil over said insulating layer.

9. The method as claimed in claim 8, wherein said insulating is made of ferrite ceramic.

10. The method as claimed in claim 9, wherein said insulating layer is made of ZnO.

11. The method as claimed in claim 8, wherein said trench has a depth of about 2~50 µm.

12. The method as claimed in claim 8, further comprising an additional insulating layer filled into spacing around said spiral conductive coil.

13. The method as claimed in claim 12, wherein said additional insulating layer is made of ferrite ceramic.

14. The method as claimed in claim 13, wherein said additional insulating layer is made of ZnO.

15. A method of fabricating an on-chip inductor, comprising the steps of:

providing a semiconductor substrate having a device thereon;

patterning the semiconductor substrate to form a trench;

forming an insulating layer in said trench, said insulating layer having a relative permitivity smaller than silicon oxide; and forming a spiral conductive coil over said insulating layer.

16. A method of fabricating an on-chip inductor, comprising the steps of:

providing a semiconductor substrate having a device thereon;

patterning the semiconductor substrate to form a trench;

forming an insulating layer in said trench, said insulating layer having a relative permeability greater than silicon oxide; and forming a spiral conductive coil over said insulating layer.

* * * * *